(12) United States Patent
Kerr et al.

(10) Patent No.: US 10,949,020 B2
(45) Date of Patent: Mar. 16, 2021

(54) FINGERPRINT-ASSISTED FORCE ESTIMATION

(71) Applicant: Apple Inc., Cupertino, CA (US)

(72) Inventors: Duncan Kerr, Cupertino, CA (US); Steven P. Hotelling, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 1251 days.

(21) Appl. No.: 14/743,115

(22) Filed: Jun. 18, 2015

(65) Prior Publication Data

US 2016/0070404 A1  Mar. 10, 2016

Related U.S. Application Data

(63) Continuation of application No. 14/417,164, filed as application No. PCT/US2013/032657 on Mar. 15, 2013, now abandoned.

(Continued)

(51) Int. Cl.
*G06F 3/041* (2006.01)
*H03K 17/96* (2006.01)
(Continued)

(52) U.S. Cl.
CPC ............ *G06F 3/0418* (2013.01); *G01L 25/00* (2013.01); *G06F 3/043* (2013.01); *G06F 3/044* (2013.01);
(Continued)

(58) Field of Classification Search
CPC .... G06K 9/001; G06K 9/00013; G01L 25/00; H03K 17/962; H03K 17/9622;
(Continued)

(56) References Cited

U.S. PATENT DOCUMENTS 4,526,043 A   7/1985  Boie et al.
4,964,302 A   10/1990  Grahn et al.
(Continued)

FOREIGN PATENT DOCUMENTS

CN   1740958   3/2006
CN   101458606   6/2009
(Continued)

OTHER PUBLICATIONS

Bau, et al., "TeslaTouch: Electrovibration for Touch Surfaces," UIST'10, Oct. 3-6, 2010, New York, New York USA, 10 pages.
(Continued)

*Primary Examiner* — Jimmy H Nguyen
(74) *Attorney, Agent, or Firm* — Brownstein Hyatt Farber Schreck, LLP

(57) ABSTRACT

Embodiments may take the form of a system having a user input device and a first sensor coupled to the user input device. The first sensor is configured to sense touch on a surface of the user input device. The system may also include a second sensor in communication with the surface of the user device configured to sense wetting of a user's fingerprint on the surface. The system has a processor coupled to the first and second sensors and configured to estimate an amount of force applied by the user's fingerprint based at least in part upon the sensed wetting of the user's fingerprint.

20 Claims, 13 Drawing Sheets

Related U.S. Application Data

(60) Provisional application No. 61/676,308, filed on Jul. 26, 2012.

(51) Int. Cl.
*G06K 9/00* (2006.01)
*G01L 25/00* (2006.01)
*G06F 3/042* (2006.01)
*G06F 3/043* (2006.01)
*G06F 3/044* (2006.01)

(52) U.S. Cl.
CPC .......... *G06F 3/0421* (2013.01); *G06K 9/001* (2013.01); *G06K 9/00013* (2013.01); *H03K 17/962* (2013.01); *H03K 17/9622* (2013.01); *H03K 17/9627* (2013.01); *H03K 17/9629* (2013.01); *H03K 17/9643* (2013.01); *G06F 2203/04105* (2013.01); *G06F 2203/04109* (2013.01); *H03K 2217/94026* (2013.01); *H03K 2217/94036* (2013.01); *H03K 2217/96003* (2013.01)

(58) Field of Classification Search
CPC .......... H03K 17/9627; H03K 17/9629; H03K 17/9643; H03K 2217/94026; H03K 2217/94036; H03K 2217/96003; G06F 2203/04109; G06F 2203/04105
USPC .................................................. 345/173–178
See application file for complete search history.

(56) References Cited

U.S. PATENT DOCUMENTS

| | | | |
|---|---|---|---|
| 5,209,126 A | 5/1993 | Grahn | |
| 5,673,041 A | 9/1997 | Chatigny et al. | |
| 5,854,450 A | 12/1998 | Kent | |
| 6,400,285 B1 * | 6/2002 | Gifford | G06F 3/0219 341/22 |
| 6,888,536 B2 | 5/2005 | Westerman et al. | |
| 7,331,245 B2 | 2/2008 | Nishimura et al. | |
| 7,538,760 B2 * | 5/2009 | Hotelling | G06F 3/0414 178/18.06 |
| 7,629,966 B2 | 12/2009 | Anson | |
| 8,169,332 B2 | 5/2012 | Son | |
| 8,201,739 B2 | 6/2012 | Schneider et al. | |
| 8,289,290 B2 | 10/2012 | Klinghult | |
| 8,363,021 B2 | 1/2013 | Krah et al. | |
| 8,395,715 B2 | 3/2013 | Yu et al. | |
| 8,421,483 B2 | 4/2013 | Klinghult et al. | |
| 8,423,089 B2 | 4/2013 | Song et al. | |
| 8,471,824 B2 | 6/2013 | Kim et al. | |
| 8,570,162 B2 | 10/2013 | Ujii et al. | |
| 8,570,297 B2 | 10/2013 | Bulea et al. | |
| 8,633,916 B2 | 1/2014 | Bernstein et al. | |
| 8,648,816 B2 | 2/2014 | Homma et al. | |
| 8,674,947 B2 | 3/2014 | Henderson et al. | |
| 8,711,122 B2 | 4/2014 | Wada et al. | |
| 8,711,128 B2 | 4/2014 | Small et al. | |
| 8,730,199 B2 | 5/2014 | Sleeman et al. | |
| 8,743,060 B2 | 6/2014 | Hotelling | |
| 8,791,899 B1 * | 7/2014 | Usey | G06F 3/03545 345/156 |
| 8,803,848 B2 | 8/2014 | Suarez Rovere | |
| 8,922,529 B2 | 12/2014 | Kim | |
| 9,024,886 B2 | 5/2015 | Doi et al. | |
| 9,024,907 B2 | 5/2015 | Bolender | |
| 9,063,593 B2 | 6/2015 | Schneider et al. | |
| 9,078,066 B2 | 7/2015 | Sheng et al. | |
| 9,127,999 B2 | 9/2015 | Tsuruno | |
| 9,170,668 B2 | 10/2015 | Schneider et al. | |
| 9,262,002 B2 | 2/2016 | Momeyer et al. | |
| 9,594,450 B2 | 3/2017 | Lynn et al. | |
| 9,891,738 B2 | 2/2018 | Huppi et al. | |
| 10,013,118 B2 | 7/2018 | Huppi et al. | |
| 10,186,286 B2 | 1/2019 | Keshavan | |
| 10,248,262 B2 | 4/2019 | Lynn et al. | |
| 10,635,217 B2 | 4/2020 | Huppi et al. | |
| 2001/0023204 A1 | 9/2001 | Komata | |
| 2006/0244733 A1 | 11/2006 | Geaghan | |
| 2008/0185281 A1 | 8/2008 | Chang et al. | |
| 2008/0198145 A1 | 8/2008 | Knowles et al. | |
| 2009/0019949 A1 | 1/2009 | Rothkopf et al. | |
| 2009/0160808 A1 | 6/2009 | Wu et al. | |
| 2009/0228791 A1 | 9/2009 | Kim et al. | |
| 2010/0066697 A1 | 3/2010 | Jacomet et al. | |
| 2010/0079382 A1 | 4/2010 | Suggs | |
| 2010/0123686 A1 | 5/2010 | Klinghult et al. | |
| 2011/0012760 A1 | 1/2011 | Klinghult | |
| 2011/0095919 A1 | 4/2011 | Ostermoeller et al. | |
| 2011/0163991 A1 * | 7/2011 | Tout | G06F 3/016 345/174 |
| 2011/0187651 A1 | 8/2011 | Whitlow et al. | |
| 2011/0199342 A1 | 8/2011 | Vartanian et al. | |
| 2011/0254762 A1 | 10/2011 | Dahl et al. | |
| 2012/0086666 A1 | 4/2012 | Badaye et al. | |
| 2012/0111119 A1 * | 5/2012 | Small | G06F 3/0412 73/633 |

FOREIGN PATENT DOCUMENTS

| | | |
|---|---|---|
| EP | 1840715 | 10/2007 |
| EP | 2141566 | 1/2010 |
| WO | WO 11/024457 | 3/2011 |

OTHER PUBLICATIONS

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

Bantz, "Keyboard Device for Upper and Lower Case Keying Without Shifting," IBM Technical Disclosure Bulletin, International Business Machines Corp. (Thornwood, vol. 21, No. 9, 1979, pp. 3845-3846.

* cited by examiner

FINGERPRINT-ASSISTED FORCE ESTIMATION

CROSS REFERENCE TO RELATED APPLICATIONS

This application is a continuation of U.S. patent application Ser. No. 14/417,164, filed Jan. 25, 2015, and entitled "Fingerprint-Assisted Force Estimation," which application is a 35 U.S.C. § 371 application of PCT/US2013/032657, which was filed on Mar. 15, 2013, and entitled "Fingerprint-Assisted Force Estimation," and further claims the benefit under 35 U.S.C. § 119(e) to U.S. provisional application No. 61/676,308, filed Jul. 26, 2012, and entitled, "Fingerprint-Assisted Force Estimation," all of which are incorporated by reference as if fully disclosed herein.

TECHNICAL FIELD

Embodiments are generally related to touch sensitive inputs for electronic devices and, more particularly, to determining a force of a touch.

BACKGROUND

Touch sensitive inputs are common in today's electronic devices. In particular, tablet computers, ebook readers, and smartphones, to name a few, all may rely upon a touch-input display as a primary form of user input. Other devices, such as trackpads, mice, and so forth may also implement touch sensitive input technology. In such devices, the position and/or movement of fingers across the surface of the display is translated as input to the device. Generally, however, the amount of information that may be provided to the device via touch is limited due to the two-dimensional nature of the touched surface.

SUMMARY

In some embodiments, fingerprint contact with the touch surface is used to determine the amount of force applied. That is, how well the fingerprint is wetted to the touch surface (e.g., in contact with the touch surface) is used as one input to determine an applied force.

One embodiment may take the form of a system having a user input device and a first sensor coupled to the user input device. The first sensor is configured to sense touch on a surface of the user input device. The first sensor may be configured to sense a touch on a surface of the user input device. The system may also include a second sensor configured to sense a characteristic of a user's fingerprint on the surface. The system may further include a processor coupled to the first and second sensors and configured to estimate an amount of force applied to the surface by the user's fingerprint based at least in part upon a ratio of ridges to valleys of the user's fingerprint.

Another embodiment may take the form of a method of approximating force. The method includes storing a calibration value in a non-transitory storage medium, determining a contact area of a finger on a fingerprint sensor, determining a ratio of ridges to valleys in the contact area, and obtaining force data from a solid state force sensor. Additionally, the method includes determining a force value based upon the force data, the contact area and the ratio.

While multiple embodiments are disclosed, still other embodiments of the present invention, will become apparent to those skilled in the art from the following Detailed Description. As will be realized, the embodiments are capable of modifications in various aspects, all without departing from the spirit and scope of the embodiments. Accordingly, the drawings and detailed description are to be regarded as illustrative in nature and not restrictive.

DETAILED DESCRIPTION

Figure 1:
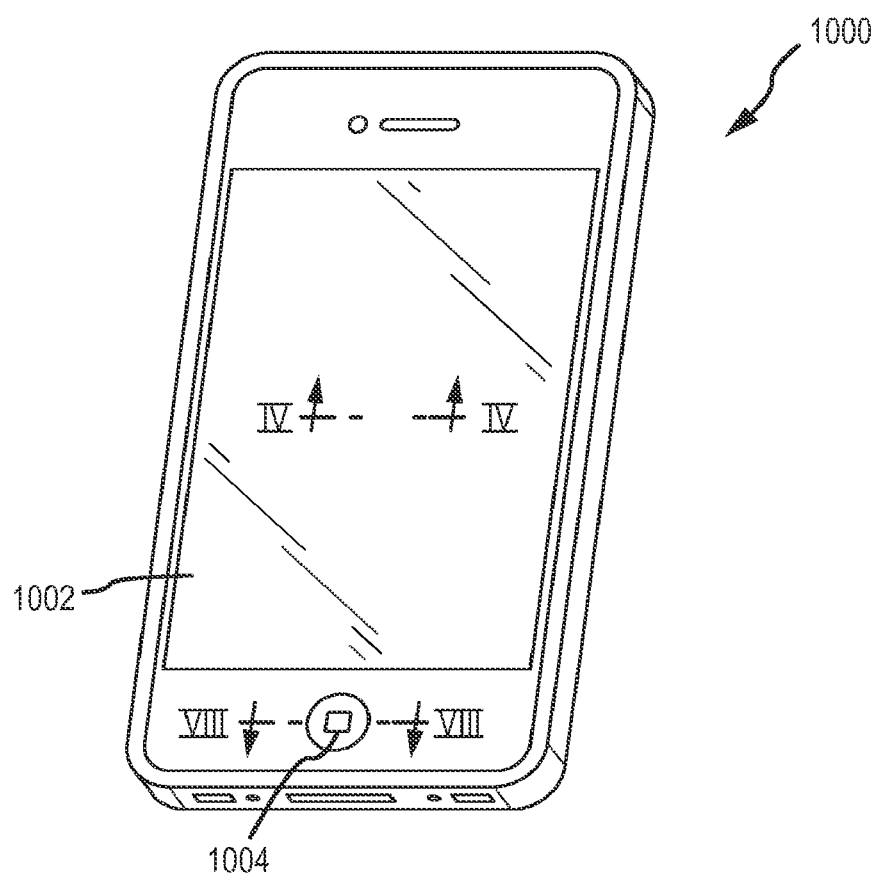
FIG. 1 illustrates an example electronic device that may implement a fingerprint assisted force determination technique.

Embodiments may take the form of systems, methods and apparatuses that estimate a force applied, by a finger. For example, an, electronic device may incorporate a screen, display or cover that senses a user's touch. The touch screen may capacitively sense the user's touch in certain embodiments. Typically, capacitive-sensing touch screens do not measure the force applied to the screen or coverglass but instead measure the presence or absence of a touch, as well as the contact size of a touch.

In particular, solid state apparatuses are discussed that measure the interaction of a finger with a coverglass. The sensing/estimating of force by a finger allows additional input to be received via a touch input device. In particular, the force of touch or a change in the force of touch may be interpreted as an additional input beyond simple touch, multi-touch, contact and/or proximity inputs.

The force measurement may be made through one or more techniques that may implement software, hardware and/or firmware beyond that which is implemented for the touch sensitivity. In some embodiments, fingerprint contact with the touch surface is used to determine the amount of force applied. That is, how well the fingerprint is wetted to the touch surface is interpreted as an applied force.

One or more technologies may be utilized in the fingerprint-assisted force sensing. For example, capacitive sensing, frustrated total internal reflectance (FTIR), ultrasonic sensing and/or other sensing technologies may be utilized. Generally, ultrasonic and/or FTIR sensing techniques depend upon a transfer of energy out of a device's coverglass. Generally, more energy transfer out of the coverglass indicates more contact and, therefore, indicates more force being applied. The ultrasonic sensing techniques generally sense reflected energy. Higher amounts of reflected energy indicate high force. As used herein, "coverglass" may refer to a cover intended for touch sensing that is glass, plastic, or another material, clear or opaque.

A fingerprint's wetting (e.g., contact) with the coverglass may vary based upon environmental conditions and biological factors. For example, in humid conditions, ridges and valleys of fingerprints may be more malleable and may provide better contact whereas dry conditions may lead to the opposite results. Additionally, certain users may have sweaty, moist or wet hands that may provide better wetting while others may have dry hands.

Some embodiments may include a calibration aimed at determining a current state of a user's fingerprint. The calibration may be conducted using a button, such as a home button or other input of an electronic device incorporating the touch screen. The button or input may be configured with a mechanical actuator that actuates at a known level of applied force, The button may further include touch and/or fingerprint sensing elements so that, at the moment the mechanical actuator, actuates, a reading of the touch/fingerprint sensor may be made and the amount of sensed touch correlated with the force of the actuation. That is, the amount of sensed touch at the moment of actuation may have a known force which may serve to calibrate the fingerprint assisted force estimation. As one example, a mechanical switch (such as a dome switch) located beneath the button may serve as the mechanical actuator. When the button is pressed with sufficient force, the switch collapses. The touch may be sensed at the moment of collapse as the force necessary to collapse the switch remains constant (e.g., the switch always collapses once the force exceeds the resistance threshold of the dome switch).

Turning to the drawings and referring initially to FIG. 1, an electronic device 1000 is illustrated which may implement fingerprint assisted force measurements. The illustrated electronic device 1000 is a smart phone, such as the iPhone® from Apple, Inc. However, it should be appreciated that various other types of devices may implement the fingerprint assisted force measurement techniques described herein. For example, a notebook computer, table computers, desktop computers, trackpads and so forth, all may implement fingerprint assisted force measurement techniques. The electronic device 1000 includes a display 1002 which may take the form of a touch screen device, such as a capacitive touch screen, or any other suitable display device.

Additionally, the device 1000 includes one or more buttons 1004 and/or other input devices. In some embodiments, the button 1004 may take the form of a home button and may be utilized as a calibration tool for the fingerprint assisted force measurements. As described in greater detail below, the button 1004 may include an element having a known force feature that may be utilized in conjunction with the fingerprint sensing to self-calibrate the device 1000.

Generally, the display 1002 and/or the button 1004 may include touch-sensitive input/output (I/O) devices. As one example, a fingerprint array sensor may be positioned beneath the button. The fingerprint sensor may capture an image of the finger when the button is touched and/or the mechanical switch located beneath the button collapses. It should be appreciated that the operation of a fingerprint sensor is generally known in the art.

Figure 2:
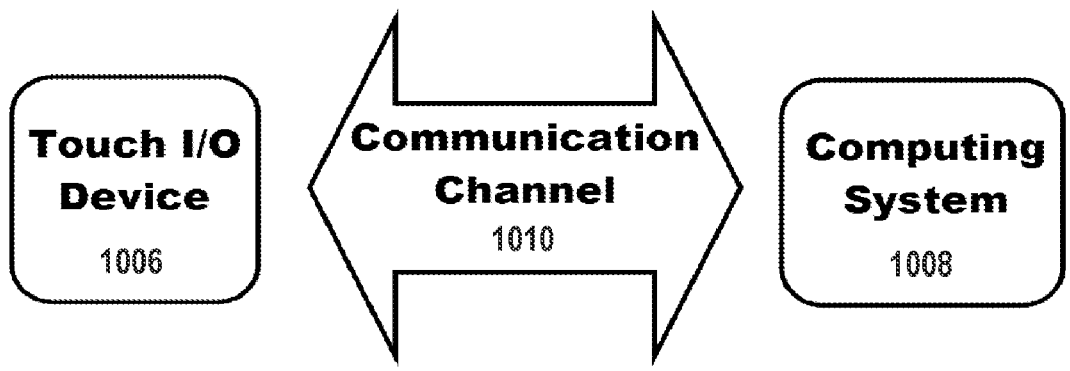
FIG. 2 is a block diagram of an example touch I/O device and a host computing system.

FIG. 2 illustrates an example block diagram showing an example embodiment including touch I/O device 1006 that can receive touch input for interacting with a computing system 1008. The communication may be via a wired or wireless communication channel 1010. Touch I/O device 1006 may be used to provide user input to computing system 1008 in lieu of or in combination with other input devices such as a keyboard, mouse, etc. One or more touch I/O devices 1006 may be used for providing user input to computing system 1008. Touch I/O device 1006 may be an integral part of computing system 1008 (e.g., touch screen on a laptop) or may be separate from computing system 1008.

Touch I/O device 1006 may include a touch sensitive panel which is wholly or partially transparent, semitransparent, non-transparent, opaque or any combination thereof. Touch I/O device 1006 may be embodied as a touch screen, touch pad, a touch screen functioning as a touch pad (e.g., a touch screen replacing the touchpad of a laptop), a touch screen or touchpad combined or incorporated with any other input device (e.g., a touch screen or touchpad disposed on a keyboard) or any multi-dimensional object having a touch sensitive surface for receiving touch input.

In one example, touch I/O device 1006 embodied as a touch screen may include a transparent and/or semitransparent touch sensitive panel partially or wholly positioned over at least a portion of a display. According to this embodiment, touch I/O device 1006 functions to display graphical data transmitted from computing system 1008 (and/or another source) and also functions to receive user input. In other embodiments, touch I/O device 1006 may be embodied as an integrated touch screen where touch sensitive components/devices are integral with display components/devices. In still other embodiments a touch screen may be used as a supplemental or additional display screen for displaying supplemental or the same graphical data as a primary display and to receive touch input.

Touch I/O device 1006 may be configured to detect the location of one or more touches or near touches on device 1006 based on capacitive, resistive, optical, acoustic, inductive, mechanical, chemical measurements, or any phenomena that can be measured with respect to the occurrences of the one or more touches or near touches in proximity to device 1006. Software, hardware, firmware or any combination thereof may be used to process the measurements of the detected touches to identify and track one or more gestures. A gesture may correspond to stationary or non-stationary, single or multiple, touches or near touches on touch I/O device 1006. A gesture may be performed by moving one or more fingers or other objects in a particular manner on touch I/O device 1006 such as tapping, pressing, rocking, scrubbing, twisting, changing orientation, pressing with varying pressure and the like at essentially the same time, contiguously, or consecutively. A gesture may be characterized by, but is not limited to a pinching, sliding, swiping, rotating, flexing, dragging, or tapping motion between or with any other finger or fingers. A single gesture may be performed with one or more hands, by one or more users, or any combination thereof.

Computing system 1008 may drive a display with graphical data to display a graphical user interface (GUI). The GUI may be configured to receive touch input via touch I/O device 1006. Embodied as a touch screen, touch I/O device 1006 may display the GUI. Alternatively, the GUI may be displayed on a display separate from touch I/O device 1006.

The GUI may include graphical elements displayed at particular locations within the interface. Graphical elements may, include but are not, limited to, a variety of displayed virtual input devices including virtual scroll wheels, a virtual keyboard, virtual knobs, virtual buttons, any virtual UI, and the like. A user may perform gestures at one or more particular locations on touch I/O device 1006 which may be associated with the graphical elements of the GUI. In other embodiments, the user may perform gestures at one or more locations that are independent of the locations of graphical elements of the GUI. Gestures performed on touch I/O device 1006 may directly or indirectly manipulate, control, modify, move, actuate, initiate or generally affect graphical elements such as cursors, icons, media files, lists, text, all or portions of images, or the like within the GUI. For instance, in the case of a touch screen, a user may directly interact with a graphical element by performing a gesture over the graphical element on the touch screen. Alternatively, a touch pad generally provides indirect interaction. Gestures may also affect non-displayed GUI elements (e.g., causing user interfaces to appear) or may affect other actions within computing system 1008 (e.g., affect a state or mode of a GUI, application, or operating system). Gestures may or may not be performed on touch I/O device 1006 in conjunction with a displayed cursor. For instance, in the case in which gestures are performed on a touchpad, a cursor (or pointer) may be displayed on a display screen or touch screen and the cursor may be controlled via touch input on the touchpad to interact with graphical objects on the display screen. In other embodiments in which gestures are performed directly on a touch screen, a user may interact directly with objects on the touch screen, with or without a cursor or pointer being displayed on the touch screen.

Feedback may be provided to the user via communication channel 1010 in response to or based on the touch or near touches on touch I/O device 1006. Feedback may be transmitted optically, mechanically, electrically, olfactory, acoustically, or the like or any combination thereof and in a variable or non-variable manner.

Figure 3:
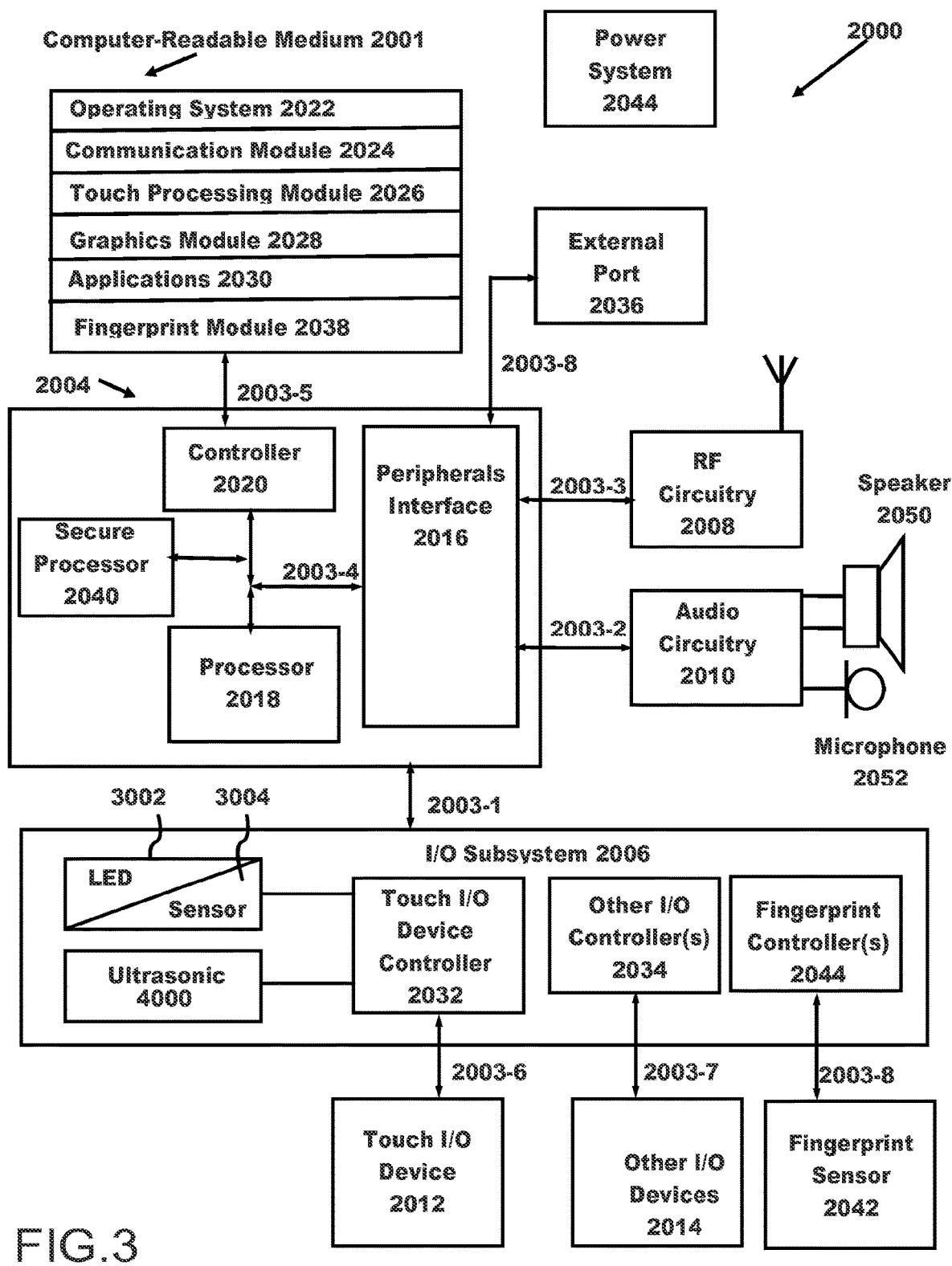
FIG. 3. is a block diagram of an example system that includes a touch I/O subsystem.

Attention is now directed towards embodiments of a system architecture that may be embodied within any portable or non-portable device including but not limited to a communication device (e.g. mobile phone, smart phone), a multi-media device (e.g., MP3 player, TV, radio), a portable or handheld computer (e.g., tablet, netbook, laptop), a desktop computer, an All-In-One desktop, a peripheral device, or any other system or device adaptable to the inclusion of system architecture 2000, including combinations of two or more of these types of devices. FIG. 3 is a block diagram of one embodiment of system 2000 that generally includes one or more computer-readable mediums 2001, processing system 2004, Input/Output (I/O) subsystem 2006, radio frequency (RF) circuitry 2008 and audio circuitry 2010. These components may be coupled by one or more communication buses or signal lines 2003.

It should be apparent that the architecture shown in FIG. 3 is only one example architecture of system 2000, and that, system 2000 could have more or fewer components than shown, or a different configuration of components. The various components shown in FIG. 3 can be implemented in hardware, software, firmware or any combination thereof, including one or more signal processing and/or application specific integrated circuits.

RF circuitry 2008 is used to send and receive information over a wireless link or network to one or more other devices and includes well-known circuitry for performing this function. RF circuitry 2008 and audio circuitry 2010 are coupled to processing system 2004 via peripherals interface 2016. Interface 2016 includes various known components for establishing and maintaining communication between peripherals and processing system 2004. Audio circuitry 2010 is coupled to audio speaker 2050 and microphone 2052 and includes known circuitry for processing voice signals received from interface 2016 to enable a user to communicate in real-time with other users. In some embodiments, audio circuitry 2010 includes a headphone jack (not shown).

Peripherals interface 2016 couples the input and output peripherals of the system to processor 2018 and computer-readable medium 2001. One or more processors 2018 communicate with one or more computer-readable mediums 2001 via controller 2020. Computer-readable medium 2001 can be any device or medium that can store code and/or data for use by one or more processors 2018. Medium 2001 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 2001 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processors 2018 run various software components stored in medium 2001 to perform various functions for system 2000. In some embodiments, the software components include operating system 2022, communication module (or set of instructions) 2024, touch processing module (or set of instructions) 2026, graphics module (or set of instructions) 2028, one or more applications (or set of instructions) 2030, and fingerprint force module (or set of instructions) 2038. Each of these modules and above noted applications correspond to a set of instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, medium 2001 may store a subset of the modules and data structures identified above. Furthermore, medium 2001 may store additional modules and data structures not described above.

Operating system 2022 includes various procedures, sets of instructions, software components and/or drivers for controlling and managing general system tasks (e.g., memory management, storage device control, power management, etc.) and facilitates communication between various hardware and software components.

Communication module 2024 facilitates communication with other devices over one or more external ports 2036 or via RF circuitry 2008 and includes various software components for handling data received from RF circuitry 2008 and/or external port 2036.

Graphics module 2028 includes various known software components for rendering, animating and displaying graphical objects on a display surface. In embodiments in which touch I/O device 2012 is a touch sensitive display (e.g., touch screen), graphics module 2028 includes components for rendering, displaying, and animating objects on the touch sensitive display.

One or more applications 2030 can include any applications installed on system 2000, including without limitation, a browser, address book, contact list, email, instant messaging, word processing, keyboard emulation, widgets, JAVA-enabled applications, encryption, digital rights management, voice recognition, voice, replication, location determination capability (such as that provided by the global positioning system (GPS)), a music player, etc.

Touch processing module 2026 includes various software components for performing various tasks associated with touch I/O device 2012 including but not limited to receiving and processing touch input received from I/O device 2012 via touch I/O device controller 2032.

System 2000 may further include fingerprint force module 2038 for, performing the method/functions as described herein in connection with FIGS. 4-11. Fingerprint force module 2038 may at least function to determine if a force threshold has been exceeded. Module 2038 may also interact with applications, software, hardware and/or other devices within the system 2000. Module 2038 may be embodied as hardware, software, firmware, or any combination thereof. Although module 2038 is shown to reside within medium 2001, all or portions of module 2038 may be embodied within other components within system 2000 or may be wholly embodied as a separate component within system 2000.

I/O subsystem 2006 is coupled to touch I/O device 2012 and one or more other I/O devices 2014 for controlling or performing various functions. Touch I/O device 2012 communicates with processing system 2004 via touch I/O device controller 2032, which includes various components for processing user touch input (e.g., scanning hardware). A fingerprint sensor 2042 and a fingerprint controller 2044 may also be included to receive and communicate the fingerprint sensing with the processing system. One or more other input controllers 2034 receives/sends electrical signals from/to other I/O devices 2014. Other I/O devices 2014 may include physical buttons, dials, slider switches, sticks, keyboards, touch pads, additional display screens, or any combination thereof.

If embodied as a touch screen, touch I/O device 2012 displays visual output to the user in a GUI. The visual output may include text, graphics, video, and any combination thereof. Some or all of the visual output may correspond to user-interface objects. Touch I/O device 2012 forms a touch-sensitive surface that accepts touch input from the user. Touch I/O device 2012 and touch screen controller 2032 (along with any associated modules and/or sets of instructions in medium 2001) detects and tracks touches or near touches (and any movement or release of the touch) on touch I/O device 2012 and converts the detected touch input into interaction with graphical objects, such as one or more user-interface objects. In the case in which device 2012 is embodied as a touch screen, the user can directly interact with graphical objects that are displayed on the touch screen. Alternatively, in the case in which device 2012 is embodied as a touch device other than a touch screen (e.g., a touch pad), the user may indirectly interact with graphical objects that are displayed on a separate display screen embodied as I/O device 2014.

Touch I/O device 2012 may be analogous to the multi-touch sensitive surface described in the following U.S. Pat. No. 6,323,846 (Westerman et al.), U.S. Pat. No. 6,570,557 (Westerman et al), and/or U.S. Pat. No. 6,677,932 (Westerman), and/or U.S. Patent Publication 2002/0015024A1, each of which is hereby incorporated by reference.

Embodiments in which touch I/O device 2012 is a touch screen, the touch screen may use LCD (liquid crystal display) technology, LPD (light emitting polymer display) technology, OLED (organic LED), or OEL (organic electro luminescence), although other display technologies may be used in other embodiments.

Feedback may be provided by touch I/O device 2012 based on the user's touch input as well as a state or states of what is being displayed and/or of the computing system. Feedback may be transmitted optically (e.g., light signal or displayed image), mechanically (e.g., haptic feedback, touch feedback, force feedback, or the like), electrically (e.g., electrical stimulation), olfactory, acoustically (e.g., beep or the like), or the like or any combination thereof and, in a variable or non-variable manner.

The I/O subsystem 2006 may include and/or be coupled to one or more sensors configured to be utilized in the force determination. In particular, the I/O subsystem 2006 may include an LED 3002 and a sensor 3004, and/or an ultrasonic sensor 4000. Each of the LED 3002, sensor 3004 and ultrasonic sensor 4000 may be coupled to the touch I/O device controller 2032, or another I/O controller (not shown). The LED 3002, sensor 3004 and ultrasonic sensor 4000 will each be discussed in greater detail below.

System 2000 also includes power system 2044 for powering the various hardware components and may include a power management system, one or more power sources, a recharging system, a power failure detection circuit, a power converter or inverter, a power status indicator and any other components typically associated with the generation, management and distribution of power in portable devices.

In some embodiments, peripherals interface 2016, one or more processors 2018, and memory controller 2020 may be implemented on a single chip, such as processing system 2004. In some other embodiments, they may be implemented on separate chips.

Figure 4:
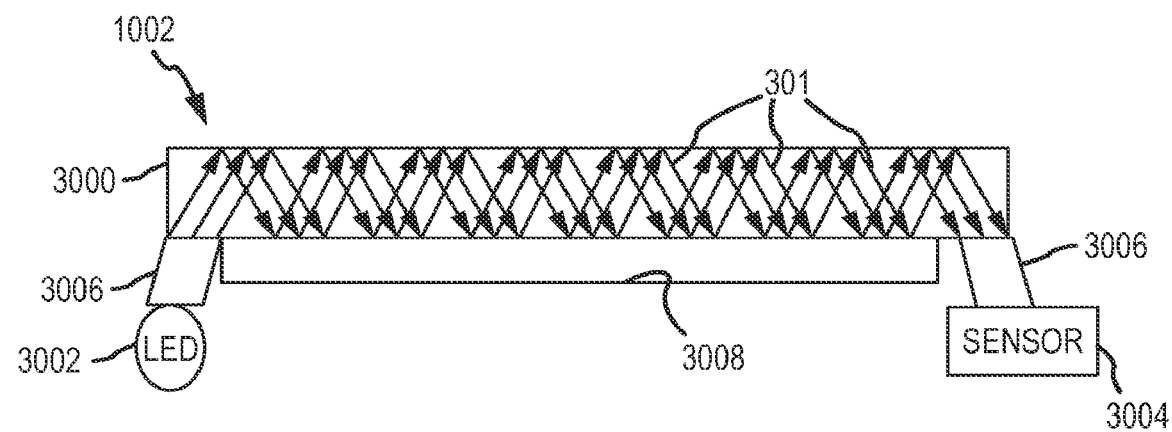
FIG. 4 is a cross-sectional view of device 1000 taken along line IV-IV in FIG. 1 and illustrating a frustrated total internal reflection sensor.

Turning to FIG. 4, a cross-sectional view taken along line in FIG. 1 illustrates the FTIR solid state sensor. In the FTIR technique, electromagnetic energy 3001, such as light, is directed into the coverglass 3000. The electromagnetic energy 3001 may be provided by any suitable device. For example, a light emitting diode 3002 may be used to provide the electromagnetic energy. A conduit such as a light guide may help inject the light into coverglass 3000. A sensor 3004 is provided to sense the level of electromagnetic energy in the coverglass 3000. A conduit such as a light guide 3006 may help extract the electromagnetic energy from the coverglass 3000. A touch sensor 3008, such as a capacitive touch sensor described above, may be located below the coverglass to sense touch.

The FTIR technique senses attenuation of the electromagnetic energy 3001 in the coverglass. That is, the coverglass 3000 may generally have an index of refraction different from that of air which may contact the coverglass. Specifically, the air or other substance in contact with the coverglass has a lower index of refraction than that of the coverglass 3000. For example, the coverglass may have an index of refraction at, near or above 1.4, whereas air may have an index of refraction of approximately 1.0. The electromagnetic energy 3001 is inserted into the coverglass so that it has an angle of incidence greater than the "critical angle." The critical angle is generally an angle relative to a normal to a boundary interface below which refraction occurs and above which total reflection occurs.

Due to the difference in the index of refraction and the angle of incidence, the electromagnetic energy inserted, into the coverglass experiences total internal reflection. That is, none of the electromagnetic energy refracts through the boundary of the coverglass. When a finger touches the coverglass, however, the electromagnetic energy refracts, thereby attenuating the electromagnetic energy reflected within the coverglass. The attenuation may be determined and correlated with an amount of force being applied.

Generally, a lighter touch will result in a lower attenuation. This is due in part to the total surface area of the finger that makes contact with the coverglass surface and allows the electromagnetic energy to refract. With a light touch, only the top of a fingerprint's ridges make contact with the coverglass surface. Contrastingly, when more force is applied, a greater surface area of the ridges will contact the coverglass surface and, thereby, result in greater attenuation through refraction.

Figure 5A:
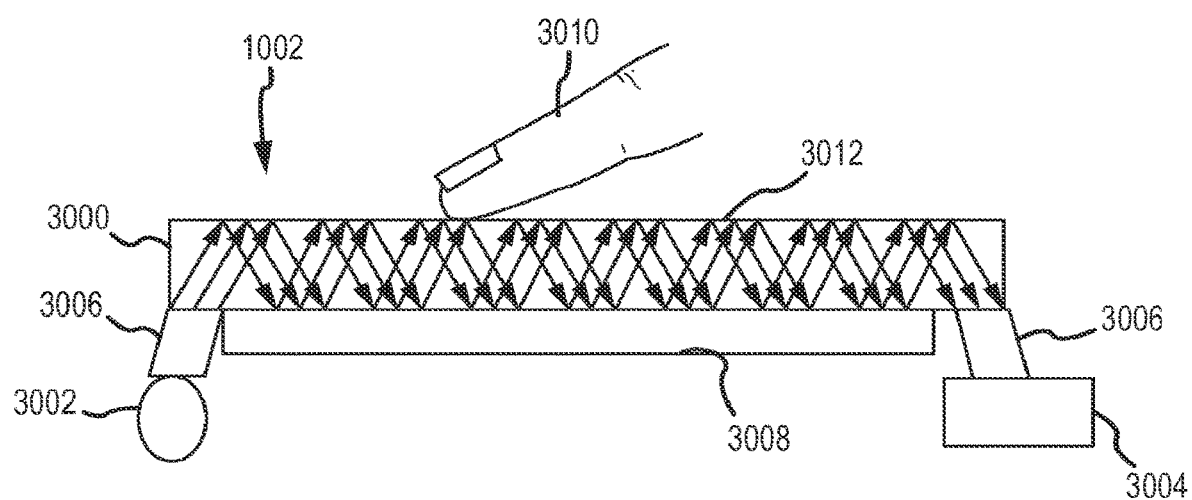
FIG. 5A illustrates the same cross-sectional view of FIG. 4 with a finger touching the coverglass.
Figure 5B:
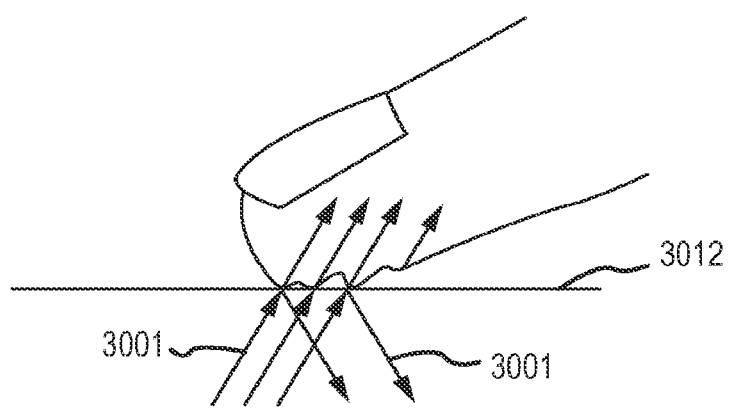
FIG. 5B is a zoomed in view of the finger touching the coverglass.

FIG. 5A illustrates a finger touching 3010 the surface 3012 of the coverglass 3000. FIG. 5B is a zoomed-in view of the finger touching the surface. As shown, the ridges of the fingerprint make contact with the surface of the coverglass and allow electromagnetic energy to escape through the boundary of the coverglass. The valleys of the fingerprint, however, do not make contact and light does not escape via the valleys. An attenuated signal 3001' remains within the coverglass 3000. The attenuated signal 3001' is sensed and a determination of force may be made based on the attenuated signal.

Figure 6:
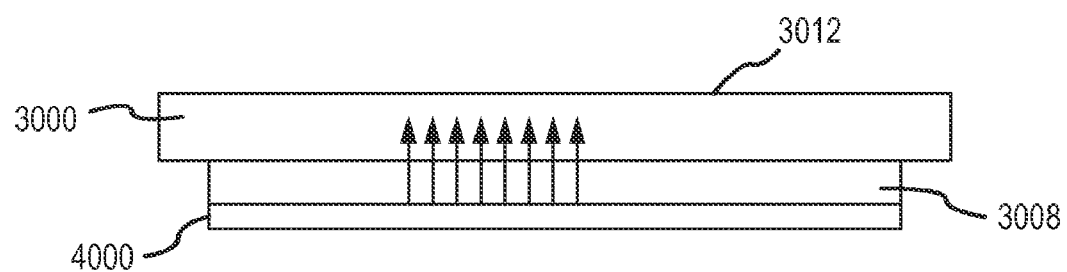
FIG. 6 illustrates the same-cross-sectional view of FIG. 4 but illustrates an ultrasonic sensor rather than the frustrated total internal reflection sensor.

Turning to FIG. 6, a cross-section view taken along line IV-IV of FIG. 1 is illustrated as having an ultrasonic sensor 4000 coupled thereto to sense force, in accordance with an alternative embodiment. The ultrasonic sensor 4000 may be located under the capacitive touch sensor 3008. The ultrasonic sensor 4000 transmits a signal up through the coverglass 3000 and then senses reflected signals. When a finger is touching the coverglass, the finger will reflect signal. For the ultrasonic sensor embodiment, a display without an air gap may be implemented. For example, an organic light emitting diode (OLED) display or liquid crystal display (LCD) may be implemented.

Figure 7A:
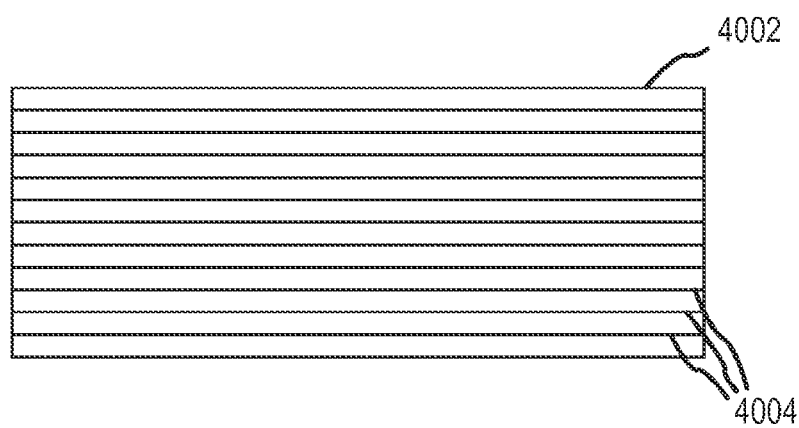
FIG. 7A illustrates a first layer of the ultrasonic sensor of FIG. 6 as having horizontal sensing elements.
Figure 7B:
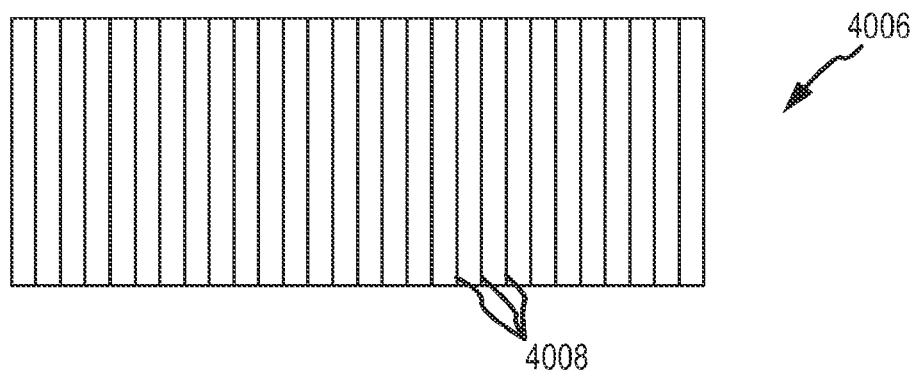
FIG. 7B illustrates a second layer of the ultrasonic sensor of FIG. 6 as having vertical sensing elements.

The ultrasonic sensor 4000 may take any suitable form and in some embodiments may take the form of a piezoelectric sensor that is actuated by applying a voltage. The ultrasonic sensor 4000 may include multiple layers. FIGS. 7A and 7B illustrate two layers of the sensor. Specifically, FIG. 7A illustrates a first layer 4002 having horizontally arranged sensors 4004. FIG. 7B illustrates a second layer 4006 having vertically arranged sensors 4008, or sensors arranged cross-wise from those of the first layer 4002. The first and second layers 4002, 4006 are stacked to form the sensor. Generally, in one embodiment for example, a pattern of pulses may be propagated through columns and reflected on the rows.

That is, the columns may be ultrasonic drivers while the rows are ultrasonic sensors, or vice-versa. In some embodiments, there may, be more ultrasonic sensors than drivers In some embodiments, the ultrasonic sensor 4000 may be configured with each sensor spaced five millimeters apart in both the vertical and horizontal direction so that the sensor has five millimeter by five millimeter pixels. In some embodiments, the ultrasonic sensor may not able to recognize a fingerprint, but could estimate where energy is being absorbed so that force may be approximated. That is, the spacing between sensors may provide a gross measurement of contact between the finger and the coverglass; this measurement may lack resolution to detect individual ridges and valleys of a fingerprint but may detect the size of the contact area with the coverglass (within the resolution of the sensors). The size of that contact patch may serve as a proxy for the force exerted by the user, as larger contact patches may equate to a larger exerted force, all other things being equal. A larger the contact area generally indicates a higher force. The system can have several different size-to-force curves stored in memory, possibly as data points in a look-up table. The curves may represent fingers having different wetting characteristics. The contact patch created when the dome switch beneath the home button collapses can be measured through the fingerprint sensor by evaluation of a ratio of the ridges to the valleys, as the size and ratio determine the amount of flesh that makes contact within the contact patch. The higher this ratio is the wetter the user's skin is. That ratio can be used to figure out which of the size-to-force curves to use for later touches on the coverglass. Thus, compensation may be made for the wetting of the person's skin and more accurately measure force, since a single reading that gives wetting information at a known force may be used as a calibration for subsequent force readings.

For each of the FTIR and ultrasonic techniques, fingerprints may vary based on temperature, moisture content, environmental conditions and so on, and this will impact how well the fingerprint is wetted to the coverglass. That is, environmental and/or biological factors may affect how well the fingerprint couples to the surface of the coverglass. As such, a calibration may be performed for each session of use of the fingerprint assisted force determination that includes an estimation of the condition of the finger.

Figure 8:
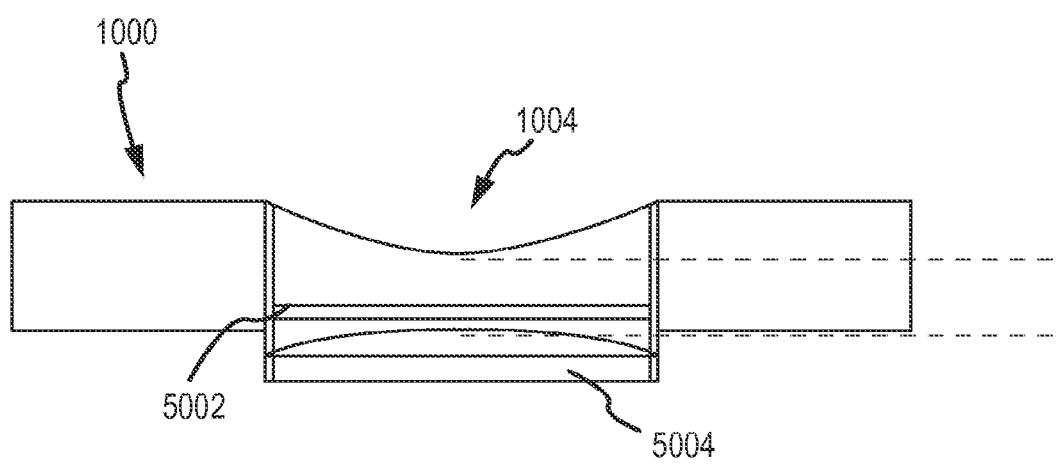
FIG. 8 is a cross-sectional view taken along line VIII-VIII in FIG. 1.

FIG. 8 is a cross-sectional view taken along line VIII-VIII in FIG. 1. The cross-section shows the structure of the button 1004. Specifically, the button 1004 includes a touch sensing element 5002 and a force threshold element 5004. The touch sensing element 5002 may take any suitable form and in some embodiments may include a capacitive touch sensor array. In other embodiments, the touch sensing element may take the form of an FTIR touch sensor, an ultrasonic sensor, or any combination of such sensors.

The force threshold element 5004 may be configured to actuate upon receiving a threshold amount of force. For example, the force threshold element may take the form of a dome or buckling switch that buckles upon application of a threshold force. The threshold force for actuation of the force threshold element 5004 may be set at any reasonable level. In some embodiments, the threshold force may be set to approximately 200 grams. That is the buckling switch may buckle when approximately 200 grams of force are applied. In other embodiments, the force threshold may be greater than or less than 200 grams force.

The touch sensing element 5002 may operate concurrently and in conjunction with the force threshold element 5004 as a calibrating tool. Specifically, at the moment that the force threshold element 5004 actuates, the touch sensing element 5002 may obtain a reading indicating the amount of contact of the finger at the threshold force level. This information may be used to know how well the finger wets with a surface and, in particular, the amount of force being applied when similar readings are achieved.

As the button 1004 may have a curved surface with which a user's finger interfaces, the touch measurements may be slightly skewed. As such, touch sensing data may be appropriately modified to translate the readings for use on a flat surface. In some embodiments, only the center portion of the button is used to read in the touch data. In other embodiments, the edge portion of the button is used to read in the touch data. In still other embodiments, a filter may be applied to limit the effects of the curved surface on the touch readings.

The data read by the touch sensor 5002 may be stored and utilized to make determinations of force applied to the touch screen. In particular, the touch sensor data may be used as an indictor of fingerprint wetting. That is, how well a person's fingerprint wets to the touch screen. As individual biological and environmental factors may influence how well a particular user's finger wets to the touch screen, the calibration provided by the touch sensor data may help to achieve more accurate force sensing results. For example, when using an FTIR sensor, in particularly humid conditions the user's finger may wet well with the surface and thus the amount of attenuation will be greater than under dry conditions. The calibration step will help to recognize that a higher amount of attenuation may be expected and avoid false positives for exceeding an actuation force level, Alternatively, reflected signals detected by the ultrasonic sensor may increase under humid conditions.

Generally, where a capacitive sensor is used as a calibration sensor, there may be two parameters of interest. Specifically, the two parameters of interest may include: (1) the average capacitance between a capacitive array and a finger, and (2) the variation of capacitance between fingerprint ridge and finger print valley. The first parameter may be used as a baseline in determining if a particular fingerprint wets better or more poorly than average. The second parameter is related to the first parameter but allows a determination as to whether the ridges alone or the ridges and valleys are in contact with, the target surface. With these two parameters it may be determined that if the signal capacitance is high then the person has good flexible prominent fingerprint that wets well to the surface (e.g., there will be a high signal voltage at moment of 200 grams of force). Hence, in the FTIR example, there will be a high attenuation of signal when user touches coverglass and the signal should be adjusted or scaled accordingly.

Figure 9:
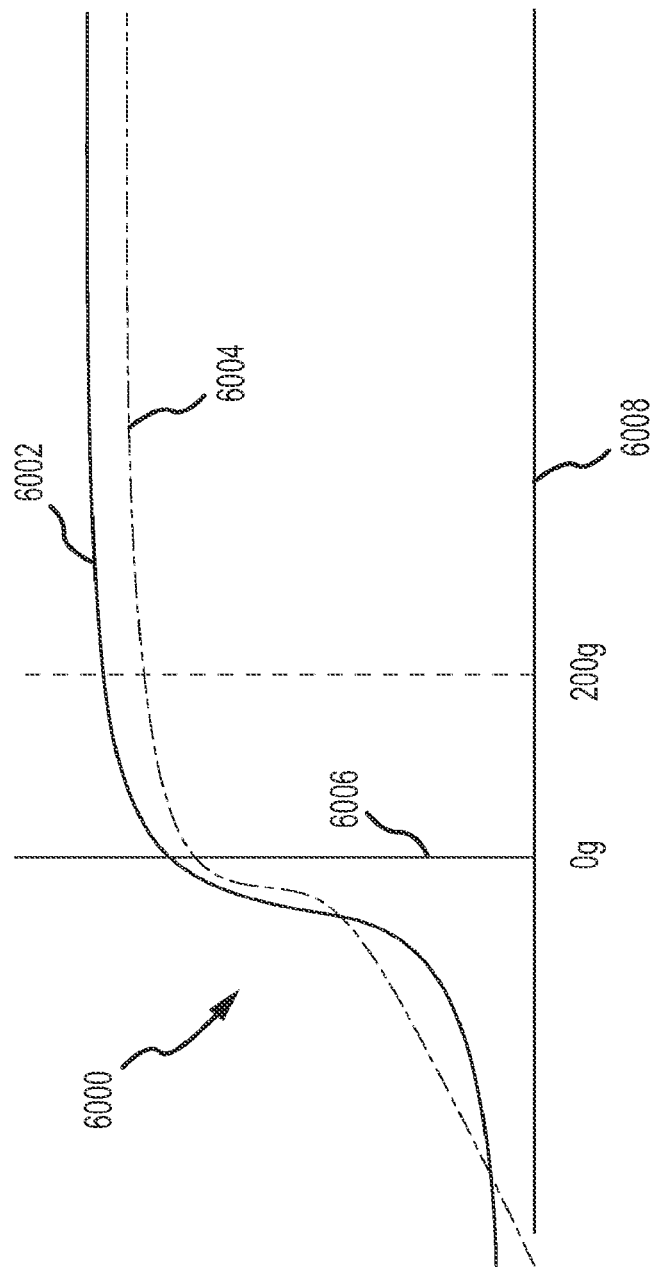
FIG. 9 is a plot showing the force sensitivity of a capacitive sensor.

FIG. 9 is a plot 6000 illustrating force sensitivity for a capacitive sensor under wet and dry conditions. For example, the plot may represent readings obtained from a user pressing on a home button. Thus, the plot 6000 may be used to help calibrate force estimations of subsequent touches on a cover glass. The solid line 6002 represents the wet conditions and the dotted line 6004 represents dry conditions. Additionally, the vertical axis 6006 represents a change in signal strength and the horizontal axis 6008 represents the amount of force applied. As shown, the capacitive sensor has a significant change in signal prior to a finger making contact with the surface. The signal flattens as force is applied in both wet and dry conditions.

Additionally, a mechanical actuator may actuate upon receiving a known force level. For example, the mechanical actuator may actuate at approximately 200 grams. Using the curves, the signal characteristics when the mechanical actuator actuates may be used to know if a user's touch registers on the "wet" curve 6002 or the "dry" curve 6004, or somewhere in between. With that information, the appropriate curve in FIG. 10 may be selected to generate a more accurate proxy for force. It should be appreciated that the wet and dry curves are related to a finger's wetting characteristics. The environment may influence this characteristic, but it's only one factor of several or many.

Figure 10:
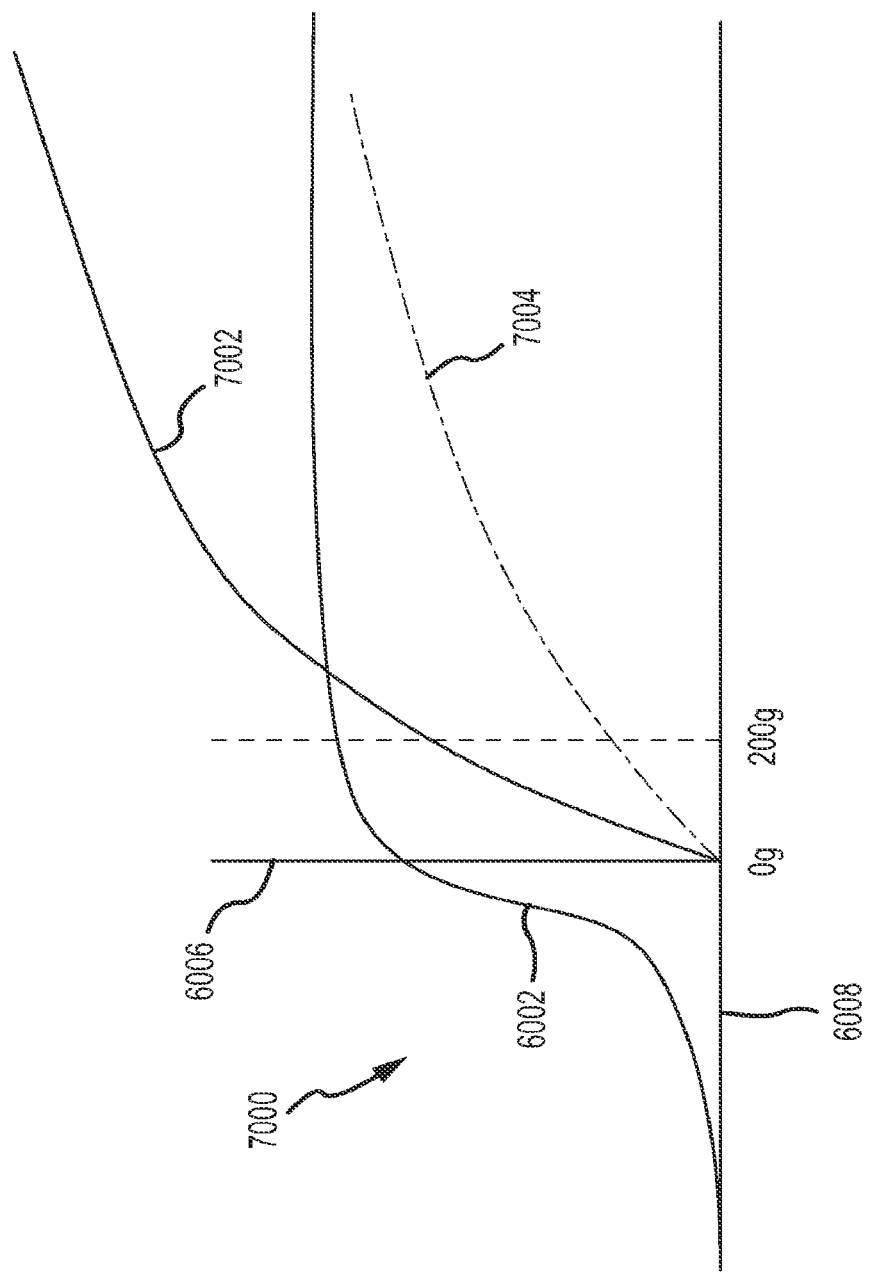
FIG. 10 is a plot comparing the force sensitivity of a capacitive sensor with that of a frustrated total internal reflection force sensor.

FIG. 10 is a plot 7000 illustrating force sensitivity for the capacitive sensor and other sensors for the purpose of comparison. The capacitive sensor plot 6002 is the same as illustrated in FIG. 9. Both wet (7002) and dry (7004) plots of the FTIR sensor are shown. In contrast to the capacitive sensor, the FTIR sensor shows sharp increases in signal changes after contact with the surface. Under dry conditions, the plot line 7004 has a shallower slope than under wet conditions. However, even under dry conditions, the FTIR sensor demonstrates significant signal changes induced by force changes. As such, the FTIR and ultrasonic sensors generally have better sensitivity to force than a capacitive sensor. Ultrasonic sensors will generally demonstrate plot characteristics similar to those of the FTIR sensor. It should be noted, however, that FIG. 10 shows merely generalized representations of force-to-signal curves. The curves may vary depending on whether FTIR or ultrasonics are, used, the configuration of the emitters and detectors, and so forth.

Generally, an object of using the plot 6000 of FIG. 9 with the curves 7002, 7004 is to use the data captured by the fingerprint sensor when the button collapses to help improve a force estimation of touches on a cover glass. If the data shows that the person has a "wet" fingerprint, and so is on curve 6002 of FIG. 9 when the button collapses, then curve 7002 may be used when the user touches the coverglass to approximate force. If the user was on curve 6004 when the button collapses, then curve 7004 is used for coverglass touches. As such, the readings from one sensor that has a known force activation point, and, is associated with a first input device (e.g., fingerprint scanner), is used to calibrate a completely different sensor associated with a completely different input device (e.g., touch screen).

Figure 11:
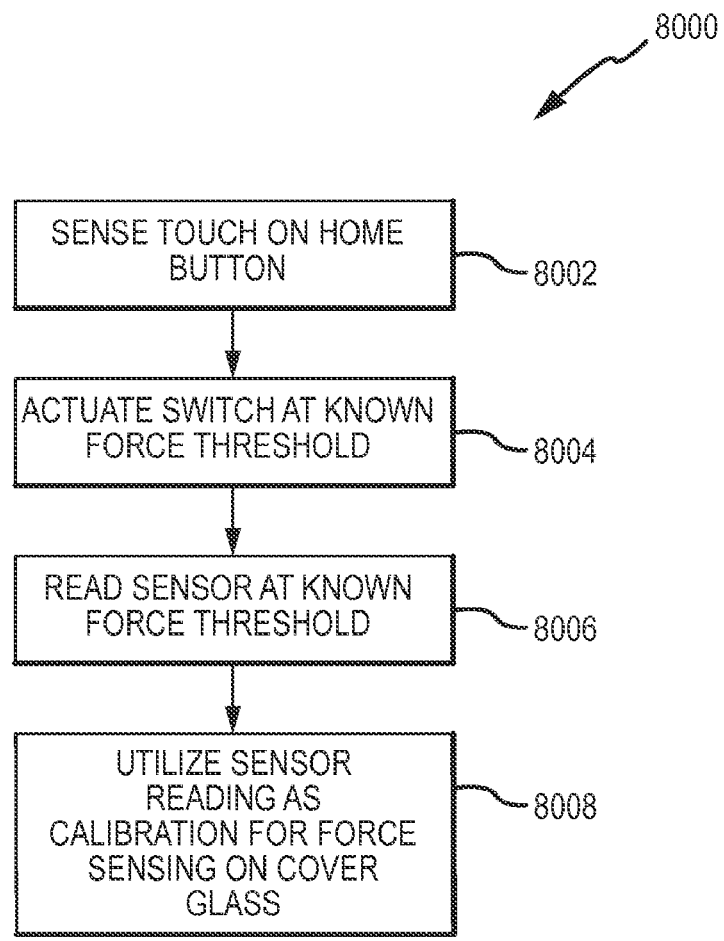
FIG. 11 is a flowchart illustrating an example method for calibrating solid state force sensor.

FIG. 11 is a flowchart illustrating an example method 8000 for implementing the fingerprint assisted force determination. The method begins by sensing a touch on the home button (Block 8002). Upon reaching a threshold level of force, the force threshold element actuates (Block 8004) and a touch sensor is read (Block 8006). The reading is then used as a calibration for force sensing on the coverglass (Block 8008). In some embodiments, a look up table may be provided that correlates the sensor reading with those that may be read from the coverglass.

The use of a lookup table may allow for estimation of force based on readings from the sensors associated with the coverglass. This information may then be used to determine when a user changes the amount of force that is being applied, for example, when making a selection, Furthermore, in some embodiments, as the amount of force increases, there may be one or more actuation thresholds that may be applied. Each force threshold may have a different action associate with it. For example, upon reaching a first force threshold (e.g. 200 grams) an area, icon or word may be highlighted or selected. Upon reaching a second force threshold (e.g. 400 grams) an action may be taken, such as autocorrect of a misspelled word, routing to a linked website, or executing a command related to an icon. As such, a diversity of functionality may be provided through multiple levels of force thresholds.

The foregoing describes some example techniques using fingerprints in force estimation. Although the foregoing discussion has presented specific embodiments, persons skilled in the art will recognize that changes may be made in form and detail without departing from the spirit and scope of the embodiments. For example, it should be appreciated that information obtained through the calibration steps may be used to scale measured force data to obtain a force value For example, the calibration may simply be a multiplier obtained from an initial wetting determination step. Furthermore, in some embodiments, a total area of a fingerprint may be used alone or in conjunction with one or more other measured or estimated parameters. For example, a capacitive touch sensor may be used to determine the total area of a fingerprint and/or a variance in the size of the area and force may be estimated based on the area or change in area. Accordingly, the specific embodiments described herein should be understood as examples and not limiting the scope thereof.

The invention claimed is:

1. A system comprising:
   a user input device;
   a first sensor coupled to the user input device, wherein the first sensor is configured to sense a contact area of a touch on a surface of the user input device;
   a second sensor configured to sense ridges and valleys of a fingerprint associated with the touch; and
   a processor coupled to the first and second sensors and configured to estimate an amount of force applied to the surface by the touch based at least in part upon an evaluation of the ridges and the valleys of the fingerprint within the contact area.

2. The system of claim 1, wherein the second sensor comprises one of a capacitive touch sensor, a frustrated total internal reflection sensor, or an ultrasonic sensor.

3. The system of claim 1, wherein the first sensor comprises a capacitive touch sensor.

4. The system of claim 1, wherein the user input device comprises a cover disposed over a display device.

5. The system of claim 4, wherein the display device comprises one of an organic light emitting diode device or a liquid crystal display device.

6. The system of claim 1, wherein the user input device comprises one of a trackpad, a mouse, or a touch screen.

7. The system of claim 1, further comprising a force calibration system.

8. The system of claim 7, wherein the force calibration system comprises: a mechanical actuator; and a touch sensor.

9. The system of claim 8, wherein the mechanical actuator comprises a button having a known force threshold.

10. The system of claim 9, wherein the known force threshold is 200 grams.

11. The system of claim 8, wherein the touch sensor comprises one of a capacitive touch sensor, a frustrated total internal reflectance sensor or an ultrasonic sensor.

12. The system of claim 7, wherein the force calibration system is integrated into a home button of the device.

13. The system of claim 7 further comprising a look up table, the look up table correlating a characteristic of the ridges and the valleys of the fingerprint sensed by the second sensor with the amount of force applied to the surface; wherein
   the processor is further configured to estimate the amount of force by referencing the look up table.

14. A method of approximating force comprising:
   storing a calibration value in a non-transitory storage medium;
   detecting, with a capacitive sensor, a contact area of a finger on a fingerprint sensor;
   detecting ridges of a fingerprint and valleys of the fingerprint of the finger with a solid state sensor;
   determining a ratio of the ridges to the valleys in the contact area; and
   determining a force value based upon the calibration value, the contact area and the ratio.

15. The method of claim 14 further comprising:
   operating a mechanical actuator, the mechanical actuator having a known force threshold; and
   capturing the calibration value by reading data from a touch sensor associated with the mechanical actuator.

16. The method of claim 15, wherein the known force threshold is 200 grams.

17. The method of claim 14, wherein the detecting ridges of the fingerprint and valleys of the fingerprint comprises operating at least one of:
   a frustrated total internal reflectance sensor; or
   an ultrasonic sensor.

18. The method of claim 14, wherein the determining the force value further comprises referencing a look-up table with the calibration value.

19. The method of claim 14, wherein the determining the force value comprises scaling force data received from the solid state sensor based on the calibration value.

20. The method of claim 14 further comprising replacing the stored calibration value upon initiation of each unique session.

* * * * *